United States Patent [19]

Henry

[11] Patent Number: 4,791,603

[45] Date of Patent: Dec. 13, 1988

[54] DYNAMICALLY RECONFIGURABLE ARRAY LOGIC

[75] Inventor: Matthew R. Henry, Albuquerque, N. Mex.

[73] Assignee: Honeywell Inc., Minneapolis, Minn.

[21] Appl. No.: 886,700

[22] Filed: Jul. 18, 1986

[51] Int. Cl.⁴ .................. G06F 7/38; H03K 19/20
[52] U.S. Cl. ........................... 364/900; 307/465
[58] Field of Search ... 364/200 MS File, 900 MS File, 364/716; 307/465; 340/825.83

[56] References Cited

U.S. PATENT DOCUMENTS

| | | | |
|---|---|---|---|
| 4,041,459 | 8/1977 | Horninger | 365/230 |
| 4,056,807 | 11/1977 | Thornber | 364/716 |
| 4,109,187 | 8/1978 | Steinberg et al. | 318/572 |
| 4,336,601 | 6/1982 | Tanaka | 364/900 |
| 4,404,519 | 9/1983 | Westcott | 324/73 AT |
| 4,415,818 | 11/1983 | Ogawa et al. | 340/825.83 |
| 4,490,812 | 12/1984 | Guterman | 364/200 |
| 4,508,977 | 2/1985 | Page et al. | 364/716 |
| 4,524,430 | 6/1985 | Page | 365/221 |
| 4,527,115 | 7/1985 | Mehrotra et al. | 324/73 R |
| 4,546,273 | 10/1985 | Osman | 364/716 |
| 4,578,771 | 3/1986 | O'Hara, Jr. | 364/716 |
| 4,609,986 | 9/1986 | Hartmann et al. | 364/200 |
| 4,617,649 | 10/1986 | Kyomasu et al. | 365/104 |

Primary Examiner—Raulfe B. Zache
Assistant Examiner—Leo Li Wang
Attorney, Agent, or Firm—Arnold L. Albin

[57] ABSTRACT

A dynamically reconfigurable array logic (DRAL) is capable of in-system logical reconfiguration in real time and comprises a RAM programmable logic array of bits, each bit comprising a fuse connection between logic elements. I/O means are coupled to the RAM programmable logic array for logical selection of registered output. A first register is coupled for receiving data and high-level commands. A sequencer includes a pair of up/down counters and functions to generate addresses. A timing device controls DMA transfers and issues READ and WRITE strobes. A second register monitors outputs and functions as a comparator, in a first mode, and functions to load outputs during specified time intervals in a second mode.

19 Claims, 4 Drawing Sheets

DYNAMICALLY RECONFIGURABLE ARRAY LOGIC

This invention was made with United States Government support and the United States Government has certain rights therein.

BACKGROUND OF THE INVENTION

1. Field of the Invention

This invention relates generally to computers and data processing systems including programmable methods or procedures and more particularly to a programmable logic array based on a RAM cell coupled with an intelligent direct memory access (DMA) controller.

2. Background of the Invention

Conventional programmable logic utilizes an array of logic gates which have selectable inputs. For instance, a 20-pin programmable logic device may contain a number of 32-input AND gates. The 32 inputs generally comprise both the true and complement of logic inputs and certain feedback signals from outputs. These AND gates, in turn, feed an array of OR gates or NOR gates. Thus, if one breaks down a desired logic function into the familiar sum-of-products form (MIN TERMS) it may be implemented by selecting only the appropriate inputs to the AND gates and possibly the OR (NOR) gates. It most programmable logic devices the connections between AND and OR (NOR) gates are fixed, sacrificing some programmable logic flexibility, but keeping device complexity at a more reasonable level.

Typically, interconnections among logic elements in the array are achieved via a fusible link or non-volatile memory cell (EPROM or EEPROM). Therefore, once a logical function for a device has been decided, it is programmed and designed into a system. At that point, the logical function of the device is fixed. It is either totally incapable of being reprogrammed, or it must be removed from the system to be reprogrammed.

The foregoing illustrates limitations known to exist in present devices. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by a dynamically reconfigurable array logic including a RAM programmable logic array comprising an array of bits, each bit comprising a fuse connection between logic elements. Input/Output (I/O) means are coupled for logical selection of registered output. A first register receives data and high level commands. A sequencer generates addresses. A timing device issues read/write (R/W) strobes and a second register monitors outputs in both a first and a second mode.

The foregoing and other aspects will become apparent from the following detailed description of the invention when considered in conjunction with the accompanying drawing. It is to be expressly understood, however, that the drawing is not intended as a definition of the invention but is for the purpose of illustration only.

DESCRIPTION OF THE PREFERRED EMBODIMENT

A dynamically reconfigurable array logic (DRAL) provides a programmable logic device with this new capability: in-system logical reconfiguration in real time. One of the keys to accomplishing this versatility is the use of a RAM cell to dictate a connect/no connect condition at each junction or "fuse" in the device. This programmable logic device is partly autonomous in a system, possessing the ability to download any of a number of logic programs from non-volatile memory to itself via a DMA controller. However, it is also system-dependent. A CPU (Central Processing Unit) interface allows a host processor to change any of the logical connections in the device simply by writing the information for those connections into a RAM. In addition, the DRAL may accept some simple high level commands, such as "download new logic pattern into X number of 'fuses' starting at address y in non-volatile memory".

Collectively, these capabilities allow the DRAL to perform many functions within a system which are not afforded by out-of-system programmable logic devices. Applications for such a real-time reconfigurable logic device include multiprocessing, memory management, fault tolerant hardware, artificial intelligence, time-shared logic, and even emulation of existing programmable logic devices for circuit development. The DRAL allows the system into which it is placed to adapt in real time, making a single set of hardware much more versatile. It is hardware which is completely alterable by software.

Figure 1:
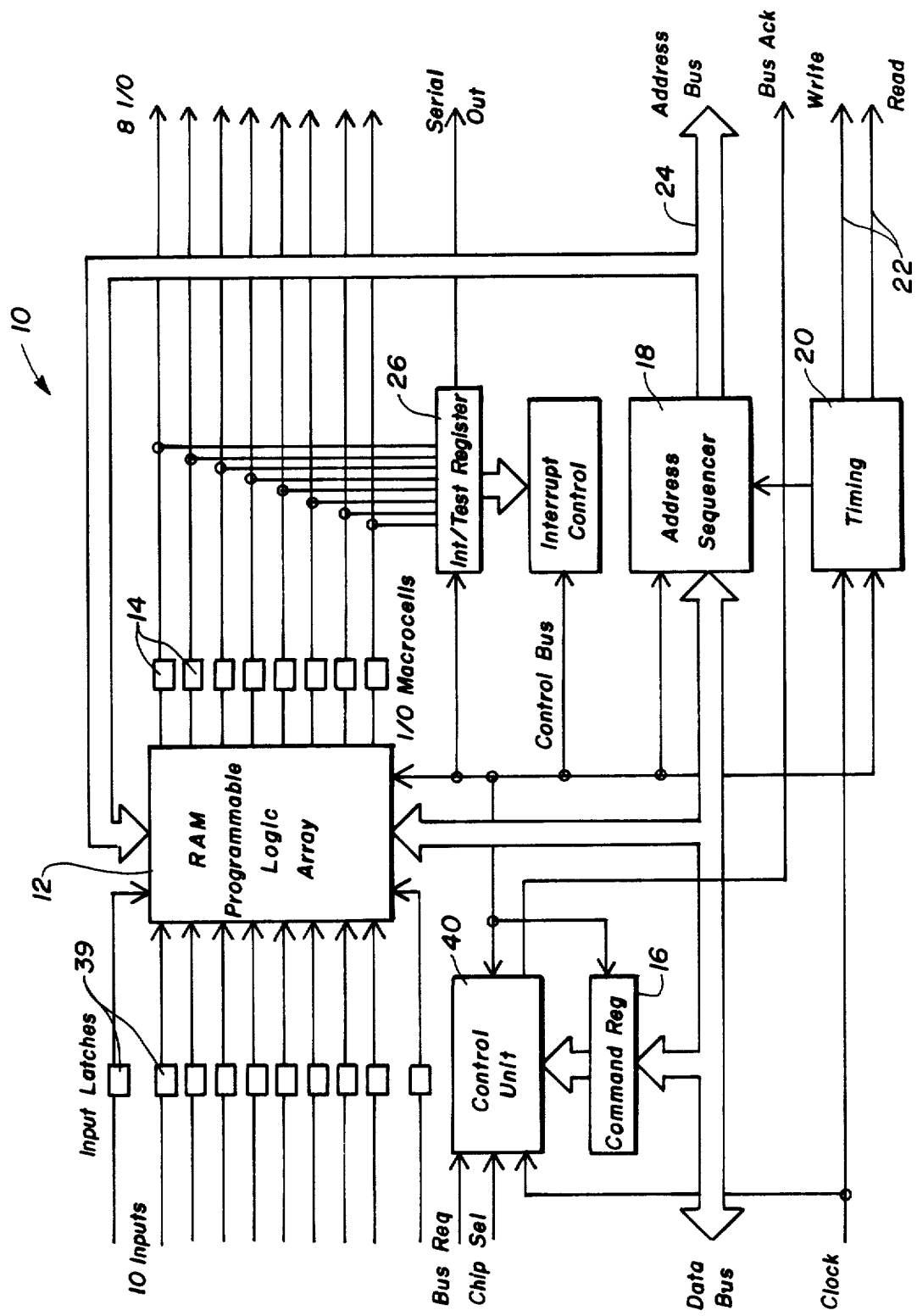
FIG. 1 is a diagrammatic view illustrating an embodiment of the dynamically reconfigurable array logic of this invention.
Figure 2:
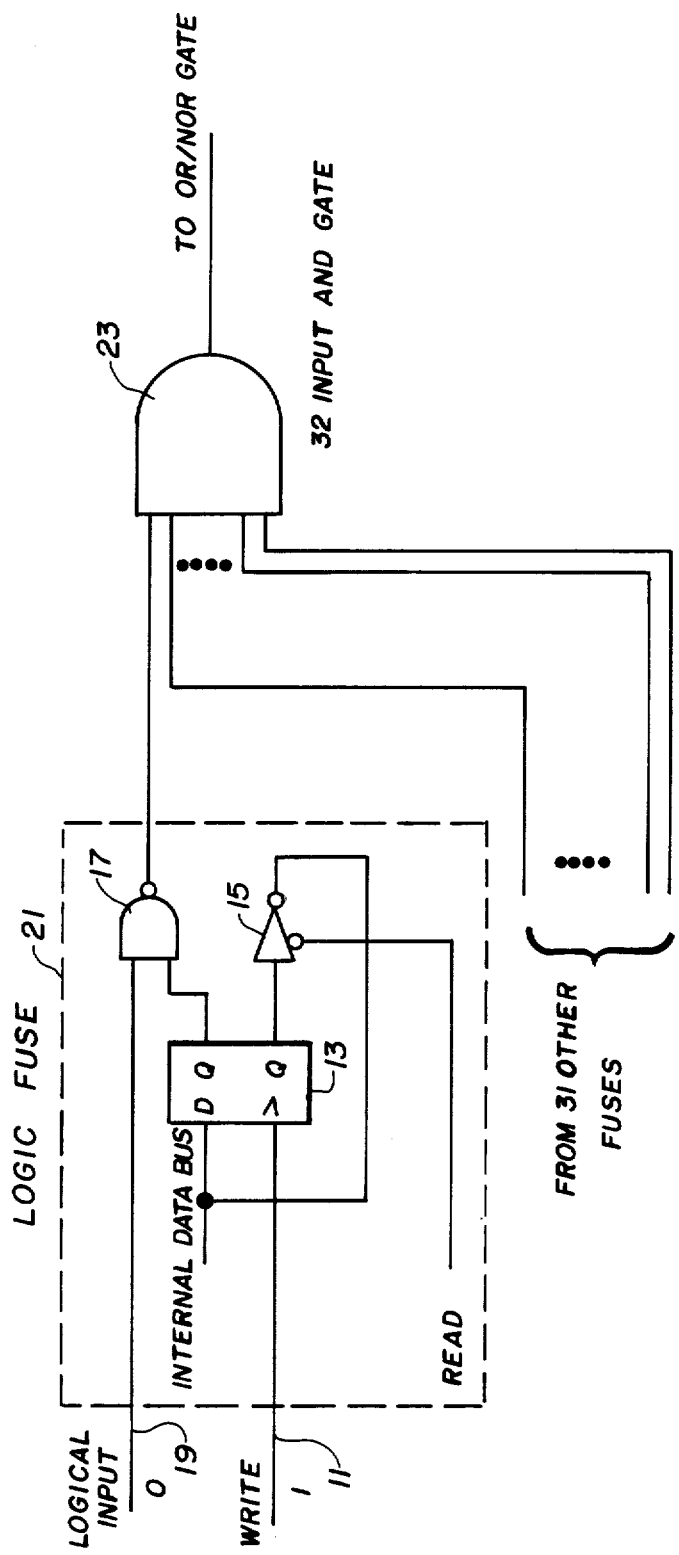
FIG. 2 is a diagrammatic view illustrating an embodiment of a RAM fuse in terms of standard logic devices.

A DRAL block diagram is designated 10 in FIG. 1. A RAM Programmable Logic Array 12 consists of an array of approximately 2000 RAM bits, each of which is equivalent to a fuse connection between logic elements. One possible implementation of a RAM fuse is shown in FIG. 2. This is merely a functional representation of a fuse in terms of standard logic devices. A real implementation of any complexity would utilize advantages of VLSI architecture to minimize the circuitry needed for each fuse. The connections are made by writing a 1 at input 11 to a particular fuse 21 including a bi-stable device 13 and a tri-state inverter 15, allowing the output of the NAND gate 17 to reflect the opposite polarity of a logic input 0 at 19 (this must be taken into account when generating a logic program). Connections are inhibited by writing logic input 0 to fuse 21, forcing the output of the NAND gate 17 high. Thus, logic input 0 to fuse 21 has no controlling action over the logical output of the product term's AND gate 23. It is possible, at the cost of a greater circuit complexity, to select the interconnections between AND and OR (NOR) gates using a second array of RAM fuses, making the DRAL a complete programmable logic array (PLA). It should be noted that the primary difference between a DRAL RAM cell 12 and a conventional RAM cell is that the output of a conventional RAM cell is only available when that cell is addressed.

A plurality of I/O macrocells 14 allows logical selection of registered output, combinatorial output, or bidirectional operation. These configurations are determined by multiplexers and are also RAM programmable. Such I/O configurations are prevalent in existing programmable logic devices.

Data is passed between DRAL 10 and other devices via an 8-bit bus. Within DRAL 10, data may be passed to a command register 16, to which a host CPU, not shown, issues high-level commands, the RAM programmable logic array 12, in which "fuses" are organized in bytes, and an address sequencer 18 comprising, a pair of up/down counters which generate addresses for autonomous DMA transfers between DRAL 10 and its logical memory. A timing controller 20 issues appropriate R/W strobes 22 to local memory to orchestrate DMA transfers. The R/W strobes 22, as well as an Address Bus 24, are bidirectional, allowing a processor to control them during transactions between itself and DRAL 10.

An interrupt/test register 26 functions in two ways, during both of which it monitors the outputs of DRAL 10. In one mode, a host CPU writes an interrupt code, starting interrupt addresses, and an address offset to DRAL 10. The interrupt/test register 26 then functions as a comparator, watching for a match between the interrupt code and the state of the DRAL 10 outputs. If a match occurs, the starting interrupt addresses are loaded into the two counters of address sequencer 18, and DRAL 10 commences downloading a new logic program from starting interrupt addresses to final interrupt addresses using direct memory access. This feature allows DRAL 10 to automatically change its own logic based on an output condition anticipated by the host processor. In a second mode, interrupt/test register 26 loads DRAL 10 outputs during each specified time interval and writes the values to its own off-board RAM. This trace function allows the CPU to read that RAM at a later date and evaluate/verify correct operation of DRAL 10. Interrupt/test register 26 also has the ability to transmit data serially for testing purposes.

Figure 3:
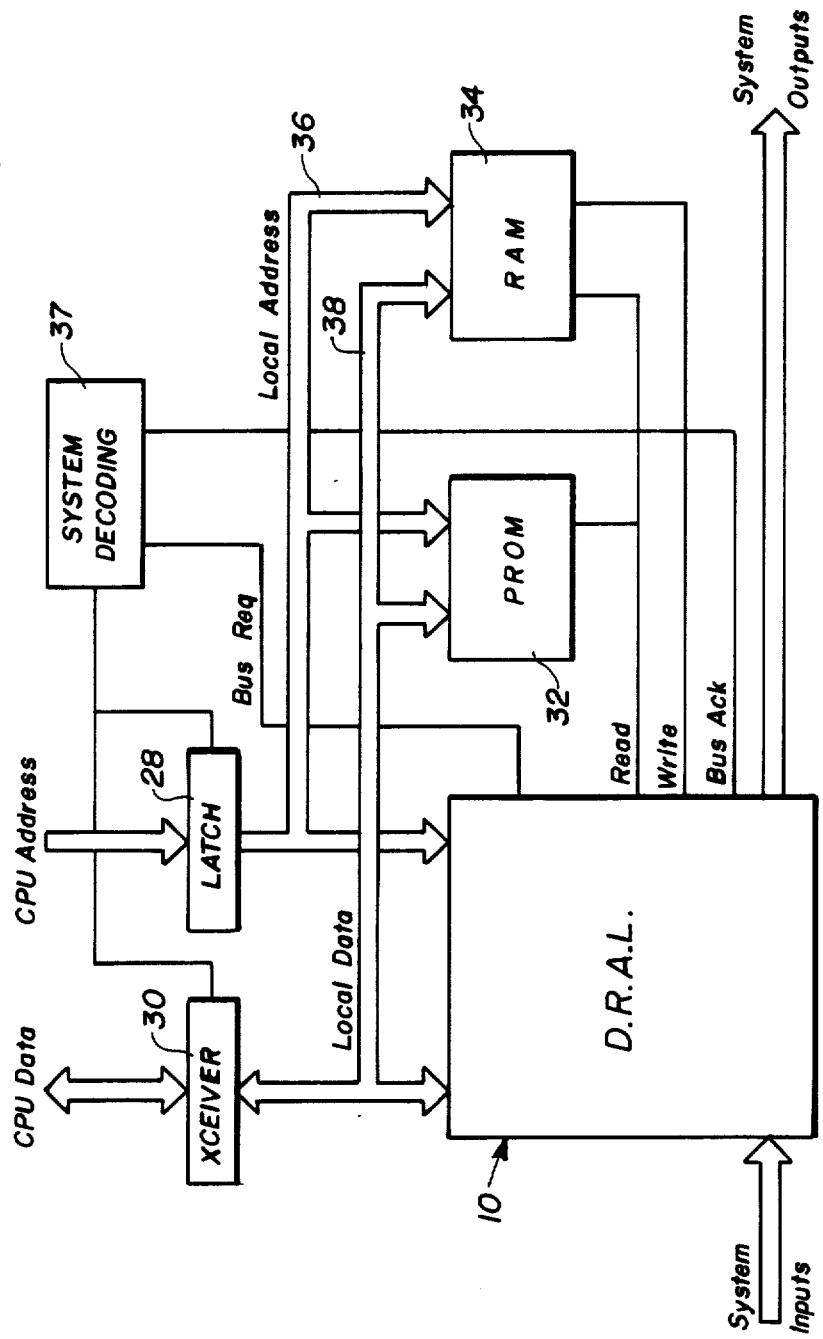
FIG. 3 is a diagrammatic view illustrating an embodiment of a typical system utilizing the dynamically reconfigurable array logic of FIG. 1.

FIG. 3 depicts a typical system configuration utilizing DRAL 10. In this configuration DRAL 10 is isolated from the main processor bus by tri-state latches 28 and transceivers 30. A bank of nonvolatile program memory 32 containing logic fusemaps for DRAL 10 must lie on its local address and data buses, 36, 38, respectively. An optional bank of RAM 34 may also lie on the local bus if trace data from DRAL 10 needs to be recorded. Address decoding 37 must also be provided to allow the CPU to select DRAL 10, which appears as an I/O device to any microprocessor.

Upon power-up, DRAL 10 disables (tri-state) its system inputs and outputs and automatically downloads the default logic map from non-volatile memory 32 into its own fuse map. With a logic configuration similar to a 20-pin PLA, this will typically consist of 2056 fuses, plus 32 fuses to configure input latches 38 and I/O macrocells 14 (see also FIG. 1). With an 8-bit data bus, 260 data transfers must take place to constitute a complete fusemap download. When the fusemap download is complete, DRAL 10 enables its system inputs and outputs, and the device commences with its operation in the system.

Figure 4:
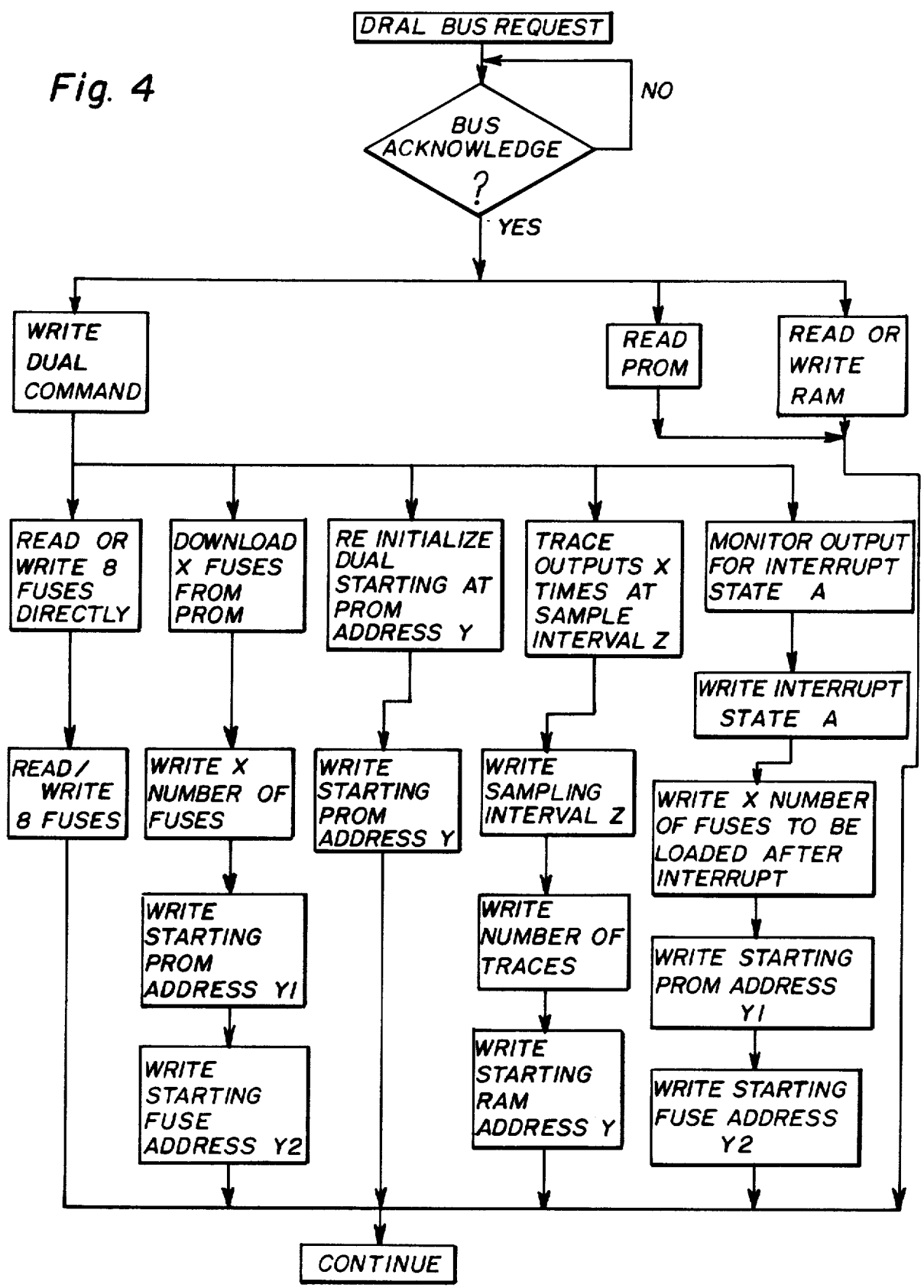
FIG. 4 is a diagrammatic view illustrating the flow of activity of an associated central processing unit (CPU).

If, at any time during operation, the logic program needs to be changed, the host CPU may do so in two ways; in either case the processor must write to command register 16 within DRAL 10. Typically the system decoding issues a bus request to DRAL 10, and the DRAL 10 bus acknolwedge signal then enables latch 28 and transceiver 30 connected to access RAM 34 or PROM 32 on the DRAL 10 local bus, or the command register 16 within DRAL 10 itself. Five command types are supported as shown in FIG. 4: (1) read or write eight fuses in the RAM array at the next address specified, (2) reload X fuse words (8 bits) starting at RAM array address Y2, and nonvolatile memory address Y1, (3) reinitialize DRAL 10 starting at nonvolatile memory address Y, (4) trace X output bytes at timing interval Z and write them to RAM starting at address Y, (5) monitor outputs for interrupt state A and reload X fuse words starting at RAM array address Y2 and nonvolatile memory address Y1 if the interrupt occurs.

Upon receiving the first type of command, a control unit 40 (FIG. 1) configures DRAL 10 to accept a host processor address for the RAM Programmable Logic Array 12. On the processor's next access to DRAL 10, it must either read or write logic fuses in the array, using its data strobe and R/W lines to control the write and read lines on DRAL 10. During a write to any of the fuses in the device, DRAL 10 isolates its inputs and outputs to the system to avoid metastable logic conditions on its outputs. The system signals are re-enabled automatically after a write cycle has been completed. A read cycle to the DRAL 10 fusemap may be completed without interference with the DRAL 10 system inputs and outputs.

After receiving a command of the second or third type, control unit 40 configures address sequencer 18 to receive data from the processor for the starting PROM 32 address, and, in the case of the second type of command, also for starting RAM Array address and address offset. These pieces of information are passed to DRAL 10 with successive write cycles from the CPU. After all address information has been received, DRAL 10 initiates DMA transfers from non-volatile memory 32 to the RAM Programmable Logic Array 12. During all such DMA transfers, DRAL 10 disables its system inputs and outputs and activates a discrete BUSY signal, which may be used to notify the system that DRAL 10 is temporarily disabled. Once all DMA download is complete, DRAL 10 continues to operate in the system using its new logic fuse map.

The fourth type of command must be accompanied by a byte describing at what interval to sample the outputs, and data words describing the number of traces and the starting trace address in RAM 34. Again, this information must accompany the command in the form of successive write cycles from the CPU. During any trace activity, DRAL 10 signals the system that its bus is busy. After the trace operation has been completed, the host processor may read the trace data from RAM 34 on the DRAL 10 local bus.

All data transfers between the system processor(s) and DRAL 10 are coordinated with the BUS REQUEST, BUS ACKNOWLEDGE, CHIP SELECT, READ, and WRITE signals. A BUS REQUEST need only be issued by the CPU prior to each command. A BUS ACKNOWLEDGE from DRAL 10 notifies the CPU that it is awaiting a CHIP SELECT, address, and READ and WRITE to complete the access cycle. If a command is written to DRAL 10, it continues to acknowledge the bus until all data which must accompany that command is written. If the BUS REQUEST is used to access the DRAL 10, local RAM 34, or PROM 32, then the BUS ACKNOWLEDGE expires immediately after the BUS REQUEST is removed. FIG. 4 illustrates the flow of CPU activity which must take place during its access to DRAL 10 or to components which lie on its local bus, including the specification of data for the four command types.

The address space of DRAL 10 should be at least 2K bytes (11 address lines), which affords it the capability to autonomously download up to seven complete logic programs. Since it is also possible for DRAL 10 to mix and match portions of logic programs in nonvolatile memory 32, the possible combinations of logic from 2K bytes of PROM 32 is virtually limitless.

The foregoing has described a programmable logic array based on a RAM cell, rather than a fusible link or EPROM cell, coupled with an intelligent DMA controller. The logic implemented in the device is reprogrammable in real time within the system. A CPU may change an individual logic term, or the DMA controller may download a logic program from non-volatile memory. This creates a block of adaptive logic which can serve several purposes in a system based on need signalled by a CPU. This invention allows its logic to take on many functions simply by rapidly downloading a new fuse pattern specifying logical interconnection. It may act as a programmable decoder or even an adaptive state machine, specifying a change in its own logic based on transitions to certain states. As a result, a single block of logic can perform multiple, time-shared functions in a system. This device could also act as a sophisticated controller for adaptive signal processing or adaptive control systems. Ideally, it would be fabricated on a single chip and would be fast enough to completely reload itself in less than 200 microseconds.

Having thus described the invention, what is claimed is:

1. A dynamically reconfigurable array logic comprising:
   a RAM programmable logic array comprising an array of bits, each bit comprising a fuse connection between logic elements;
   I/O means coupled to the RAM programmable logic array for logical selection of registered output;
   first register means coupled to the RAM programmable logic array for receiving data and high level commands;
   sequencer means coupled to the RAM programmable logic array for generating addresses, said sequencer means comprising a pair of up/down counters;
   timing means coupled to the RAM programmable logic array for issuing READ and WRITE strobes; and
   second register means coupled to the RAM programmable logic array for monitoring outputs in both a first mode and a second mode.

2. The array logic of claim 1 wherein the timing means controls DMA transfers.

3. The array logic of claim 1 wherein the second register means includes an interrupt/test register.

4. The array logic of claim 1 wherein, during the first mode, the second register means loads addresses into the counters of the sequencer means.

5. A dynamically reconfigurable array logic comprising:
   a RAM programmable logic array comprising an array of bits, each bit comprising a fuse connection between logic elements;
   I/O means coupled to the RAM programmable logic array for logical selection of a registered output;
   first register means coupled to the RAM programmable logic array for receiving data and high level commands;
   a pair of up/down counters coupled to the RAM programmable logic array;
   timing means coupled to the RAM programmable logic array for issuing READ and WRITE strobes; and
   bus means for coupling control signals between said RAM programmable logic array, said first register means and second register means;
   said second register means coupled to the RAM programmable logic array for functioning as a comparator in a first mode and for functioning to load outputs during specified time intervals in a second mode, said second register means responsive in said first mode to said control signals from said first register means and to output signals from said I/O means, for comparing said control signals and said output signals and for providing portions of said control signals to said RAM programmable logic array when said compared signals are equal, thereby to reconfigure said logic array.

6. The array logic of claim 5 wherein, during the first mode, the second register means loads addresses into the counters.

7. The array logic of claim 5 wherein the timing means controls DMA transfers.

8. The array logic of claim 5 wherein the second register means monitors output.

9. A dynamically reconfigurable array logic comprising:
   A RAM programmable logic array comprising an array of bits, each bit comprising a fuse connection between logic elements;
   I/O means coupled to the RAM programmable logic array for logical selection of registered output;
   first register means coupled to the RAM programmable logic array for receiving data and high-level commands;
   sequencer means, including a pair of up/down counters, coupled to the RAM programmable logic array for generating addresses;
   timing means coupled to the RAM programmable logic array for controlling DMA transfers and for issuing READ and WRITE strobes; and
   bus means for coupling control signals between said RAM programmable logic array, said first register means, and second register means;
   said second register means coupled to the RAM programmable logic array for monitoring outputs and for functioning as a comparator in a first mode and for functioning to load outputs during specified time intervals in a second mode, said second register means responsive in said first mode to control signals from said first register means and to output signals from said I/O means, for comparing said control signals and said output signals and for providing portions of said control signals to said RAM programmable logic array when said compared signals are equal, thereby to reconfigure said logic array.

10. The array logic of claim 9 wherein the RAM programmable logic array is coupled to tri-state latches and transceivers.

11. The array logic of claim 10 wherein the RAM programmable logic array is coupled to a PROM and a RAM via a local data bus and local address bus.

12. The array logic of claim 1 wherein the sequencer means includes a pair of up/down counters; and
wherein the timing means controls DMA transfers.

13. The array logic of claim 1 wherein the sequencer means includes a pair of up/down counters;
wherein the timing means controls DMA transfers; and
wherein the second register means includes an interrupt/test register.

14. The array logic of claim 1 wherein the sequencer means includes a pair of up/down counters;
wherein, during the first mode, the second register means loads addresses into the counters of the sequencer means;
wherein the second register means includes an interrupt/test register.

15. The array logic of claim 1 wherein the timing means controls DMA transfers; and
wherein the second register means includes an interrupt/test register.

16. The array logic of claim 1 wherein the sequencer means includes a pair of up/down counters;
wherein, during the first mode, the second register means loads addresses into the counters of the sequencer means; and
wherein the timing means controls DMA transfers.

17. The array logic of claim 1 wherein the sequencer means includes a pair of up/down counters;
wherein, during the first mode, the second register means loads addresses into the counters of the sequencer means; and
wherein the second register means includes an interrupt/test register.

18. The array logic of claim 5 wherein the second register means monitors output; and
wherein, during the first mode, the second register means loads addresses into the counters.

19. The array logic of claim 5 wherein the second register means monitors output;
wherein, during the first mode, the second register means loads addresses into the counters; and
wherein the timing means controls DMA transfers.

* * * * *